(12) United States Patent
Ding

(10) Patent No.: US 12,550,320 B2
(45) Date of Patent: Feb. 10, 2026

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Li Ding, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 454 days.

(21) Appl. No.: 18/152,979

(22) Filed: Jan. 11, 2023

(65) Prior Publication Data
US 2024/0015957 A1    Jan. 11, 2024

(30) Foreign Application Priority Data
Jul. 5, 2022    (CN) .......................... 202210783607.6

(51) Int. Cl.
H10B 20/25    (2023.01)
(52) U.S. Cl.
CPC .................................. H10B 20/25 (2023.02)
(58) Field of Classification Search
CPC ...................................................... H10B 20/25
See application file for complete search history.

(56) References Cited

U.S. PATENT DOCUMENTS

| 9,666,484 B2 * | 5/2017 | Regnier | ............. | H10D 30/0411 |
| 10,964,399 B2 | 3/2021 | Ha | | |
| 11,127,752 B2 * | 9/2021 | Hsu | ..................... | H10D 30/0285 |

FOREIGN PATENT DOCUMENTS

| CN | 105849861 B | 8/2018 |
| CN | 111402946 A | 7/2020 |
| WO | 2015149182 A1 | 10/2015 |

* cited by examiner

*Primary Examiner* — Peniel M Gumedzoe
(74) *Attorney, Agent, or Firm* — Syncoda LLC; Feng Ma

(57) ABSTRACT

The present disclosure relates to the technical field of semiconductors, and provides a semiconductor structure and a manufacturing method thereof. The semiconductor structure includes an anti-fuse unit, and the anti-fuse unit includes a selection unit and a memory cell. The semiconductor structure further includes: a substrate; a gate provided in the substrate, where in a cross section perpendicular to the substrate, the gate includes a first sidewall and a second sidewall opposite to each other; a first doped region, provided in the substrate and close to the first sidewall; a second doped region, provided in the substrate and close to the second sidewall; and an oxide layer, covering a partial surface of the gate. The gate, the first doped region and the oxide layer form the memory cell; the gate, the first doped region, the second doped region, and the oxide layer form the selection unit.

17 Claims, 11 Drawing Sheets

SEMICONDUCTOR STRUCTURE AND MANUFACTURING METHOD THEREOF

CROSS-REFERENCE TO RELATED APPLICATION

This application claims the priority of Chinese Patent Application No. 202210783607.6, submitted to the Chinese Intellectual Property Office on Jul. 5, 2022, the disclosure of which is incorporated herein in its entirety by reference.

TECHNICAL FIELD

The present disclosure relates to the technical field of semiconductors, and in particular to a semiconductor structure and a manufacturing method thereof.

BACKGROUND

An anti-fuse is a commonly used One Time Program (OTP), which is widely used in memory chips.

The anti-fuse consists of a memory cell and a selection unit. When applied to memory chips, the anti-fuse requires at least two semiconductor devices to as the memory cell and the selection unit respectively, and the memory cell and selection unit should not be too close to each other. Otherwise, the performance of the selection unit device will deteriorate during breakdown of the memory cell, affecting the reliability of the circuit. The structure of the anti-fuse occupies a large area of the memory chip, which is not conducive to improving the memory density of the memory chip and further miniaturization of the memory chip.

SUMMARY

An overview of the subject described in detail in the present disclosure is provided below. This overview is not intended to limit the protection scope of the claims.

The present disclosure provides a semiconductor structure and a manufacturing method thereof.

A first aspect of the present disclosure provides a semiconductor structure, including at least one anti-fuse unit that each includes a selection unit and a memory cell, where the semiconductor structure includes:
  a substrate;
  a gate, provided in the substrate, where in a cross section perpendicular to the substrate, the gate includes a first sidewall and a second sidewall opposite to each other;
  a first doped region, provided in the substrate and close to the first sidewall;
  a second doped region, provided in the substrate and close to the second sidewall; and
  an oxide layer, covering a partial surface of the gate;
  where the gate, the first doped region and the oxide layer form the memory cell; the gate, the first doped region, the second doped region, and the oxide layer form the selection unit.

A second aspect of the present disclosure provides a method of manufacturing a semiconductor structure, including:
  providing a substrate, and forming a first trench in the substrate;
  forming an oxide layer, wherein the oxide layer covers a bottom wall and part of a sidewall of the first trench, and a top surface of the oxide layer is lower than a top surface of the substrate;
  forming a gate, where the gate covers the oxide layer and fills up part of the first trench, a top surface of the gate is flush with a top surface of the oxide layer, and in a cross section perpendicular to the substrate, the gate includes a first sidewall and a second sidewall opposite to each other; and
  forming a first doped region and a second doped region in the substrate, wherein the first doped region is provided in the substrate and close to the first sidewall, and the second doped region is provided in the substrate and close to the second sidewall;
  where the gate, the first doped region, and the oxide layer form a memory cell; the gate, the first doped region, the second doped region, and the oxide layer form a selection unit; and the memory cell and the selection unit jointly form an anti-fuse unit.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the semiconductor structure and the manufacturing method thereof provided by the embodiments of the present disclosure, the selection unit and the memory cell of the anti-fuse unit share the gate. Part of the oxide layer can be broken down by applying a voltage to the gate, such that a logic state of the memory cell is read through the selection unit, thereby reducing the size of the anti-fuse unit and providing more available space for the semiconductor structure.

An anti-fuse, as a commonly used One Time Program (OTP), is applied to dynamic random access memory (DRAM) and a NAND flash memory (NAND). The anti-fuse includes an anti-fuse structure, and a transistor adjacent to the anti-fuse structure in a memory array is used as a select transistor for the anti-fuse. When the select transistor is turned on, a programmed voltage or programmed current is applied to the anti-fuse structure. The anti-fuse structure is a semiconductor device consisting of two conductive layers and a dielectric layer between the conductive layers. When the anti-fuse structure is not programmed, the conductive layers are separated by the dielectric layer and two terminals of the anti-fuse structure are disconnected. When the anti-fuse structure is programmed (when an external high voltage is applied), the dielectric layer is broken down by the high voltage, an electrical connection is formed between the two conductive layers, and the anti-fuse structure is short-circuited (broken down). This breakdown process is physically one-time, permanent and irreversible.

The size of the anti-fuse is relatively large and occupies a large area in the memory, which is not conducive to the installation of more memory cells in the memory and continued reduction of the memory size.

Figure 1:
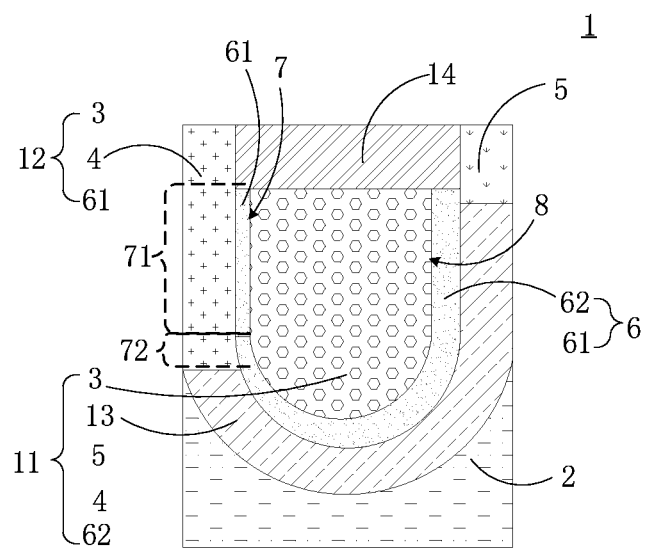
FIG. 1 is a schematic diagram of a semiconductor structure according to an exemplary embodiment.
Figure 2:
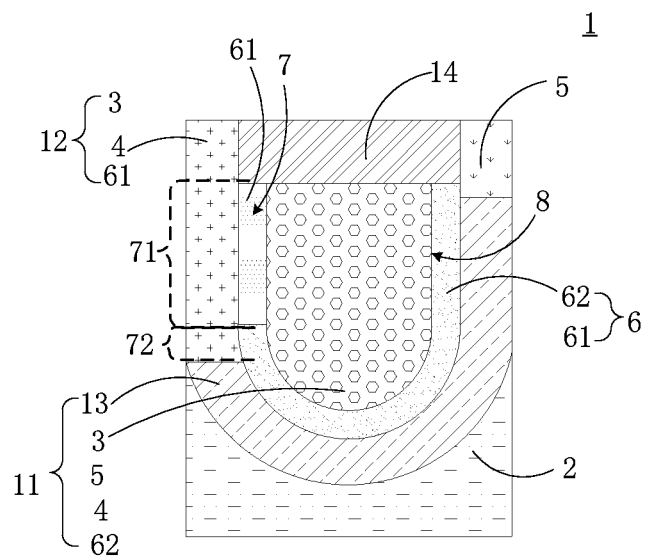
FIG. 2 is a schematic diagram of a semiconductor structure according to an exemplary embodiment.

An exemplary embodiment of the present disclosure provides a semiconductor structure. As shown in FIG. 1 and FIG. 2, the memory structure includes at least one anti-fuse unit 1. The anti-fuse unit 1 includes a selection unit 11 and a memory cell 12. As shown in FIG. 1 and FIG. 2, the semiconductor structure includes a substrate 2, a gate 3, a first doped region 4, a second doped region 5, and an oxide layer 6. The oxide layer 6 covers a partial surface of the gate 3. The gate 3 is provided in the substrate 2. In a cross section perpendicular to the substrate 2, the gate 3 includes a first sidewall 7 and a second sidewall 8 opposite to each other. The first doped region 4 is provided in the substrate 2 and close to the first sidewall 7. The second doped region 5 is provided in the substrate 2 and close to the second sidewall 8. The gate 3, the first doped region 4, and the oxide layer 6 form the memory cell 12. The gate 3, the first doped region 4, the second doped region 5, and the oxide layer 6 form the selection unit 11.

As shown in FIG. 1 and FIG. 2, in a cross section perpendicular to the substrate 2, a top surface of the gate 3 is higher than a bottom surface of the first doped region 4 and a bottom surface of the second doped region 5. The oxide layer 6 covers the first sidewall 7, the second sidewall 8, and a bottom surface of the gate 3. The gate 3 and the substrate 2 are separated by the oxide layer 6. In this embodiment, the anti-fuse unit 1, the selection unit 11, and the memory cell 12 share the gate 3. Part of the oxide layer 6 can be broken down by applying a voltage to the gate 3, such that an electrical connection is established between the gate 3 and the first doped region 4 without configuring an adjacent transistor to serve as a select transistor of the anti-fuse unit 1, thereby reducing the size of the anti-fuse unit 1 to release more available space for the semiconductor structure.

According to an exemplary embodiment, as shown in FIG. 1 and FIG. 2, the oxide layer 6 includes a first oxide layer 61 and a second oxide layer 62. The memory cell 12 includes a first oxide layer 61, and the selection unit 11 includes a second oxide layer 62. For example, the first doped region 4 and the first sidewall 7 are partially separated by the first oxide layer 61, and partially separated by the second oxide layer 62. The second oxide layer 62 also covers the second sidewall 8 and the bottom surface of the gate 3. The second sidewall 8 and the bottom surface of the gate 3 are separated by the second oxide layer 62 and the substrate 2.

As shown in FIG. 1 and FIG. 2, projection of the first doped region 4 on the first sidewall 7 covers projection of the first oxide layer 61 on the first sidewall 7, and the second oxide layer 62 includes the oxide layer 6 other than the first oxide layer 61. In this embodiment, as shown in FIG. 1 and FIG. 2, in a cross section perpendicular to the substrate 2, a bottom surface of the first oxide layer 61 is higher than a bottom surface of the first doped region 4. For example, in a direction from the top surface to the bottom surface of the gate 3, the first sidewall 7 includes a first part 71 and a second part 72 that are arranged sequentially. A bottom surface of the first part 71 is higher than the bottom surface of the first doped region 4. The first oxide layer 61 is located between the first part 71 and the first doped region 4, and the second oxide layer 62 is located between the second part 72 and the first doped region 4. The second oxide layer 62 is further located between the second sidewall 8 and the substrate 2, and between the bottom surface of the gate 3 and the substrate 2.

In this embodiment, the first oxide layer 61 and the second oxide layer 62 have different breakdown voltages. The breakdown voltage of the first oxide layer 61 is lower than the breakdown voltage of the second oxide layer 62. It is easier to break down the first oxide layer 61 than the second oxide layer 62. For example, the breakdown voltage of the first oxide layer 61 is a first voltage V1, and the breakdown voltage of the second oxide layer 62 is higher than the first voltage V1. That is, the first oxide layer 61 can be broken down by applying the first voltage V1 to the gate 3, which causes the gate 3 and the first doped region 4 to be short-circuited.

As shown in FIG. 1 and FIG. 2, the selection unit 11 further includes a third doped region 13 provided in the substrate 2. The third doped region 13 is located between the first doped region 4 and the second doped region 5 and surrounds part of the oxide layer 6. Moreover, a conductive type of dopant ions of the first doped region 4 is the same as a conductive type of dopant ions of the second doped region 5; a conductive type of dopant ions of the third doped region 13 are opposite to the conductive types of the dopant ions of the first doped region 4 and the second doped region 5. For example, the dopant ions of the first doped region 4 and the second doped region 5 have an N-type conductive doping type; the dopant ions of the third doped region 13 have a P-type conductive doping type. Alternatively, the dopant ions of the first doped region 4 and the second doped region 5 have a P-type conductive doping type, and the dopant ions of the third doped region 13 have an N-type conductive doping type.

Referring to FIG. 1 and FIG. 2, in this embodiment, during writing of the anti-fuse unit 1, the first doped region 4 is floated, and the first voltage V1 is applied to the gate 3 to break down the first oxide layer 61, thereby forming a conductive path between the gate 3 and the first doped region 4. Because the first voltage V1 does not reach the breakdown voltage of the second oxide layer 62, the second oxide layer 62 will not be broken down, and the selection unit 11 continues to work.

In this embodiment, during a reading operation of the anti-fuse unit 1, a second voltage V2 less than the first voltage V1 is applied to the gate 3. Driven by the second voltage V2, the selection unit 11 is turned on, to produce induced charge in the third doped region 13 under the gate 3 through an effect of fringing electric field, thereby forming a conductive channel in the third doped region 13. Charge in the first doped region 4 moves to the second doped region 5 through the conductive channel, and a logical value of the anti-fuse unit 1 can be read through the second doped region 5.

In this embodiment, the oxide layer 6 consists of the first oxide layer 61 and the second oxide layer 62 having different breakdown voltages. The value of the breakdown voltage of the oxide layer 6 is related to a dielectric constant and thickness of the oxide layer 6. Q=CV, where Q denotes the quantity of electric charge, U denotes a voltage, and C denotes a capacitance. An equivalent capacitance $$C = \frac{Q}{V}.$$

With the quantity of electric charge remains unchanged, the value of the breakdown voltage of the oxide layer 6 is inversely proportional to the equivalent capacitance of the oxide layer 6. In this embodiment, a dielectric constant of the first oxide layer 61 is greater than a dielectric constant of the second oxide layer 62; and/or, a thickness of the first oxide layer 61 is less than a thickness of the second oxide layer 62, causing the breakdown voltage of the first oxide layer 61 to be lower than the breakdown voltage of the second oxide layer 62, such that a region that can be easily broken down is formed between the first doped region 4 and the first sidewall 7.

In some embodiments, as shown in FIG. 2, the thickness of the first oxide layer 61 is the same as the thickness of the second oxide layer 62, the dielectric constant of the first oxide layer 61 is greater than the dielectric constant of the second oxide layer 62, and the breakdown voltage of the first oxide layer 61 is higher than the breakdown voltage of the second oxide layer 62.

In some embodiments, as shown in FIG. 1, the dielectric constant of the first oxide layer 61 is the same as the dielectric constant of the second oxide layer 62, the thickness of the first oxide layer 61 is less than the thickness of the second oxide layer 62, and the breakdown voltage of the first oxide layer 61 is lower than the breakdown voltage of the second oxide layer 62. It is understandable that, as shown in FIG. 1, the thickness of the second oxide layer 62 may not be uniform, provided that the thickness of the second oxide layer 62 at any position is greater than that of the first oxide layer 61.

In some embodiments, the dielectric constant of the first oxide layer 61 is greater than the dielectric constant of the second oxide layer 62, and the thickness of the first oxide layer 61 is less than the thickness of the second oxide layer 62, such that a breakdown critical voltage of the first oxide layer 61 is lower, that is, the first voltage V1 is lower, thus reducing the breakdown difficulty of the first oxide layer 61 and the breakdown time of the first oxide layer 61.

As shown in FIG. 1 and FIG. 2, in some embodiments, the top surface of the gate 3 is lower than the top surface of the substrate 2. The semiconductor structure further includes an insulating layer 14 that covers the top surface of the gate 3 and the top surface of the oxide layer 6, where a top surface of the insulating layer 14 is flush with the top surface of the substrate 2.

Figure 3:
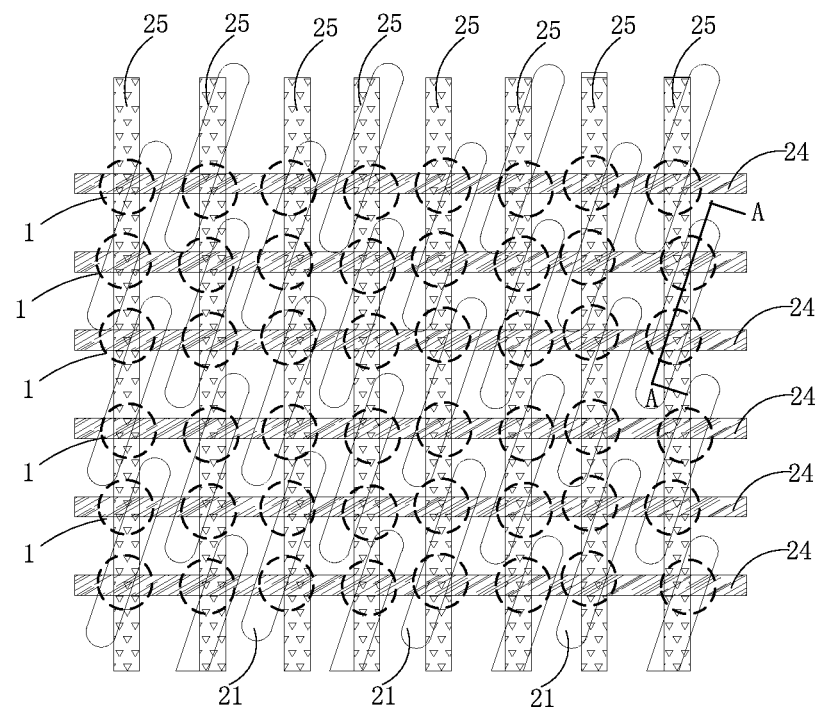
FIG. 3 is a top view of a semiconductor structure according to an exemplary embodiment.
Figure 4:
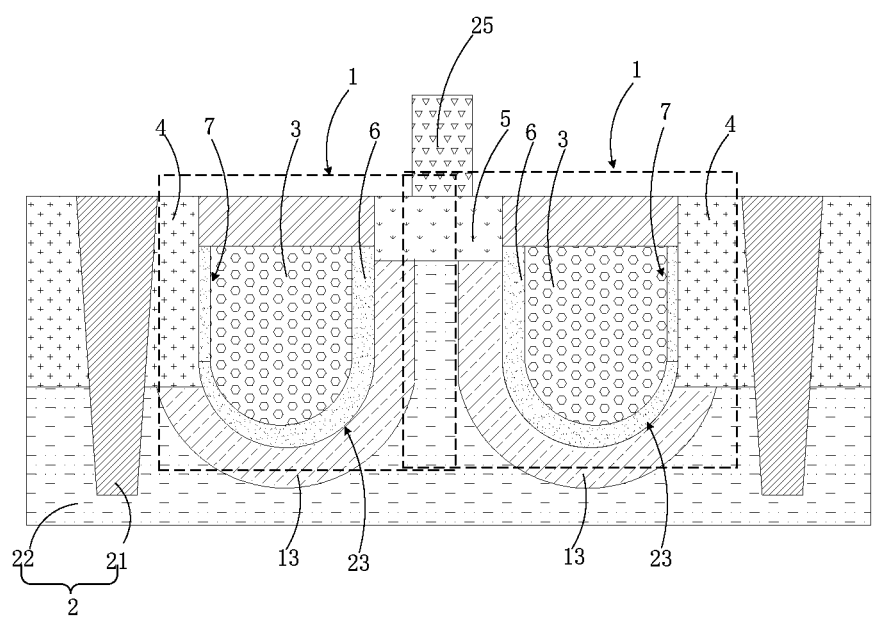
FIG. 4 is a cross-sectional view of a semiconductor structure taken along plane A-A according to an exemplary embodiment.

According to an exemplary embodiment, a semiconductor structure is provided. The semiconductor structure in this embodiment includes all parts of the semiconductor structure in the foregoing embodiment. In this embodiment, as shown in FIG. 3 and FIG. 4, the substrate 2 includes isolation structures 21. The isolation structures 21 divide the substrate 2 into a plurality of independent active regions 22. In a cross section perpendicular to the substrate 2, a bottom surface of the isolation structure 21 is lower than the bottom surface of the gate 3. Two first doped regions 4 are provided at both ends of each active region 22 respectively, and a second doped region 5 is provided in the middle of the active region 22. The active region 22 further includes first trenches 23. The first trench 23 is arranged between the first doped region 4 and the second doped region 5, and each active region 22 includes two first trenches 23.

As shown in FIG. 3 and FIG. 4, a gate 3 is provided in each first trench 23. The gate 3, the first doped region 4, and the oxide layer 6 form the memory cell 12; the gate 3, the first doped region 4, the second doped region 5, and the oxide layer 6 form the selection unit 11; the selection unit 11 and the memory cell 12 jointly form the anti-fuse unit 1. As shown in FIG. 4, the selection unit 11 further includes a third doped region 13 provided in the substrate 2. The third doped region 13 surrounds part of the oxide layer 6; the first doped region 4 and the second doped region 5 are connected through the third doped region 13.

As shown in FIG. 3 and FIG. 4, two anti-fuse units 1 are formed in each active region 22, where the two anti-fuse units 1 share the same second doped region 5. Two adjacent anti-fuse units 1 are located in the same active region 22 or separated by the isolation structure 21.

In this embodiment, as shown in FIG. 3, the semiconductor structure further includes word lines 24. The word line 24 extends in the substrate 2. The gate 3 is electrically connected to the word line 24, and a programmed voltage may be applied to the gate 3 through the word line 24.

In this embodiment, as shown in FIG. 3 and FIG. 4, the semiconductor structure further includes bit lines 25. The bit line 25 extends on the substrate 2. An extension direction of the bit line 25 intersects with an extension direction of the word line 24. The bit line 25 is electrically connected to the second doped region 5, and a logical value of the anti-fuse unit 1 can be read through the bit line 25.

In the semiconductor structure of this embodiment, the number of semiconductor devices forming the anti-fuse unit 1 is reduced, and it is unnecessary to configure an additional select transistor for the anti-fuse unit 1, thereby reducing the area occupied by the anti-fuse unit 1 and providing more available space for the semiconductor structure.

Figure 5:
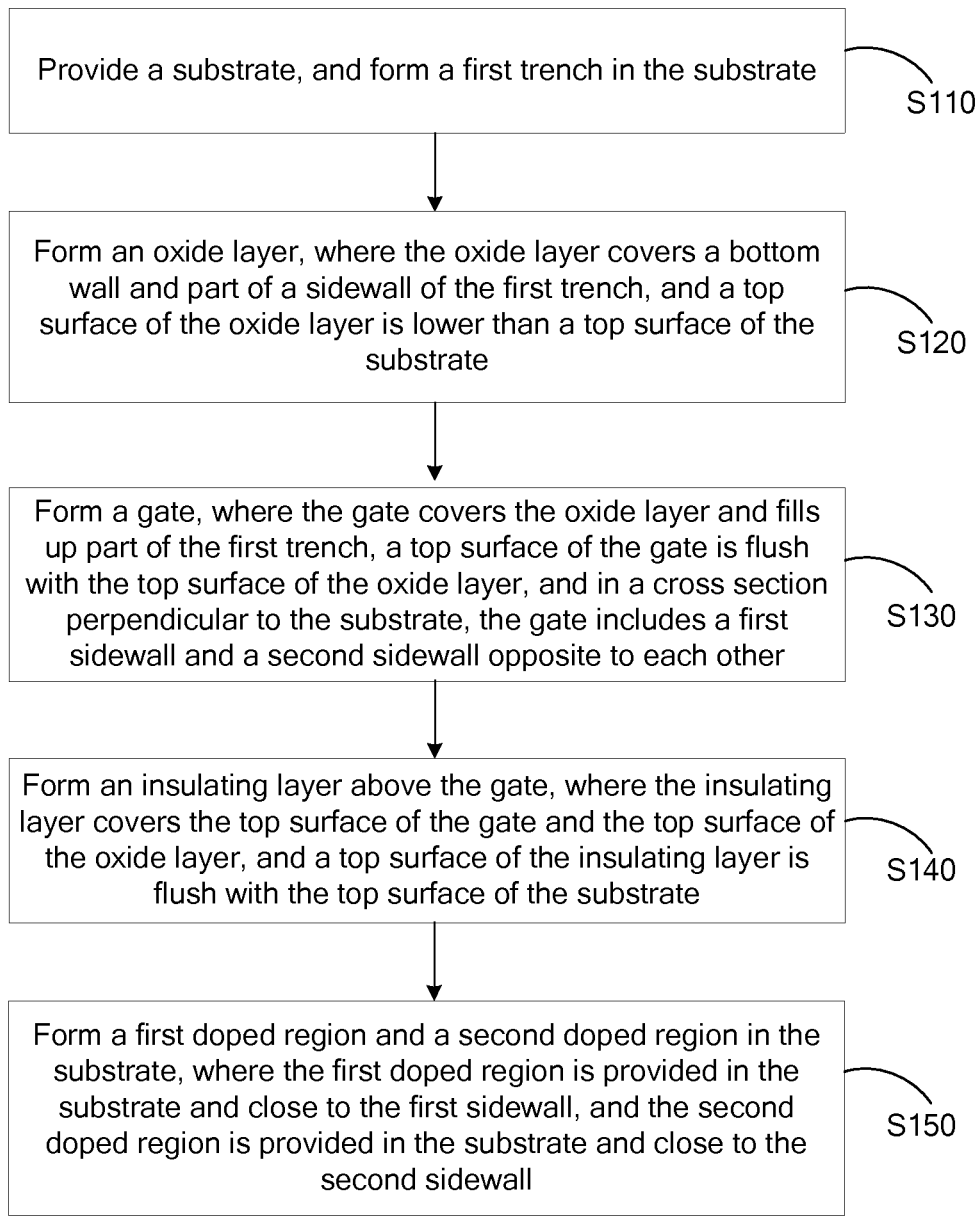
FIG. 5 is a flowchart of a method of manufacturing a semiconductor structure according to an exemplary embodiment.

An exemplary embodiment of the present disclosure provides a method of manufacturing a semiconductor structure, as shown in FIG. 5. FIG. 5 is a flowchart of a method of manufacturing a semiconductor structure according to an exemplary embodiment of the present disclosure. FIG. 9 to FIG. 23 are schematic diagrams of various states of a method of manufacturing a semiconductor structure. The method of manufacturing a semiconductor structure is described below with reference to FIG. 9 to FIG. 23.

The semiconductor structure is not limited in this embodiment. That the semiconductor structure is a DRAM is used as an example below for description, but this embodiment is not limited thereto. Alternatively, the semiconductor structure in this embodiment may be other structures.

As shown in FIG. 5, an embodiment of the present disclosure further provides a method of manufacturing a semiconductor structure. The method of manufacturing a semiconductor structure includes:

Step S110: Provide a substrate, and form a first trench in the substrate.

Figure 9:
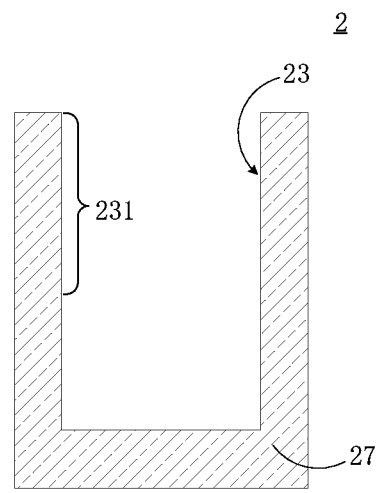
FIG. 9 is a schematic diagram of a substrate according to an exemplary embodiment.

Referring to FIG. 9, the substrate 2 may be a semiconductor substrate. The semiconductor substrate may include a silicon substrate, a germanium (Ge) substrate, a silicon germanide (SiGe) substrate, a silicon-on-insulator (SOI) substrate or a germanium-on-insulator (GOI) substrate, or the like.

In this embodiment, the substrate 2 includes an initial doped region 27. FIG. 9 shows the initial doped region 27 of the substrate 2. It is understandable that the substrate 2 may further include other structures. The substrate 2 may include one or more initial doped regions 27. Dopant ions of the initial doped region 27 have a first conductive doping type, which may be a P-type conductive doping type or an N-type conductive doping type. Referring to FIG. 9, the initial doped region 27 is partially removed through etching, to form a first trench 23 in the substrate 2. A depth of the first trench 23 is less than a doping depth of the initial doped region 27, and the retained initial doped region 27 surrounds a wall of the first trench 23.

Step S120: Form an oxide layer, where the oxide layer covers a bottom wall and part of a sidewall of the first trench, and a top surface of the oxide layer is lower than a top surface of the substrate.

Figure 14:
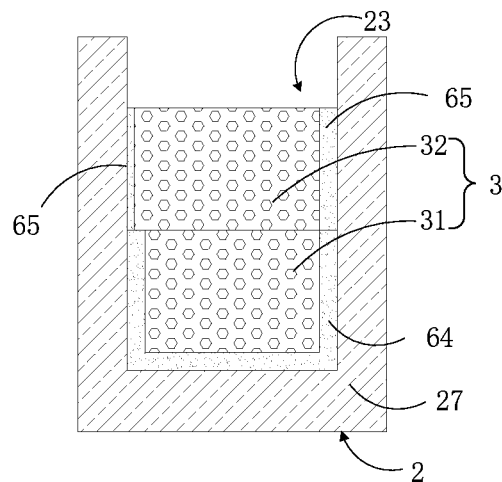
FIG. 14 is a schematic diagram of forming an oxide layer according to an exemplary embodiment.
Figure 19:
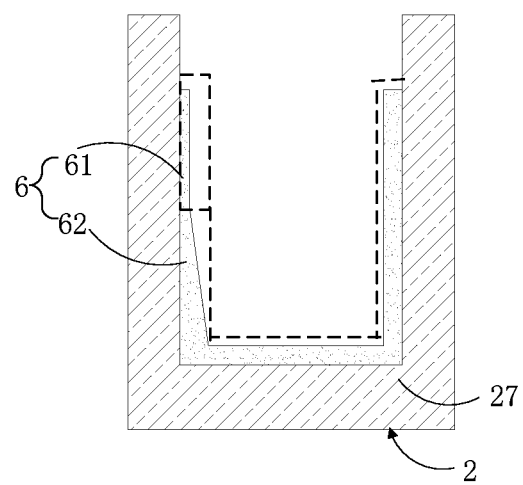
FIG. 19 is a schematic diagram of forming an oxide layer according to an exemplary embodiment.
Figure 22:
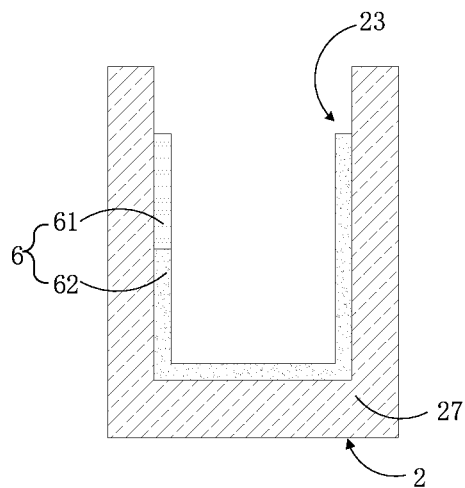
FIG. 22 is a schematic diagram of forming an oxide layer according to an exemplary embodiment.

As shown in FIG. 14, FIG. 19, and FIG. 22, the oxide layer 6 may be formed by any one of the following deposition processes: chemical vapor deposition (CVD), physical vapor deposition (PVD), atomic layer deposition (ALD) or sputtering. The oxide layer 6 covers the bottom wall and part of the sidewall of the first trench 23, and the top surface of the oxide layer 6 is lower than the top surface of the substrate 2. The oxide layer 6 may be made of a material such as silicon oxide or silicon oxynitride.

Step S130: Form a gate, where the gate covers the oxide layer and fills up part of the first trench, a top surface of the gate is flush with the top surface of the oxide layer, and in a cross section perpendicular to the substrate, the gate includes a first sidewall and a second sidewall opposite to each other.

Figure 20:
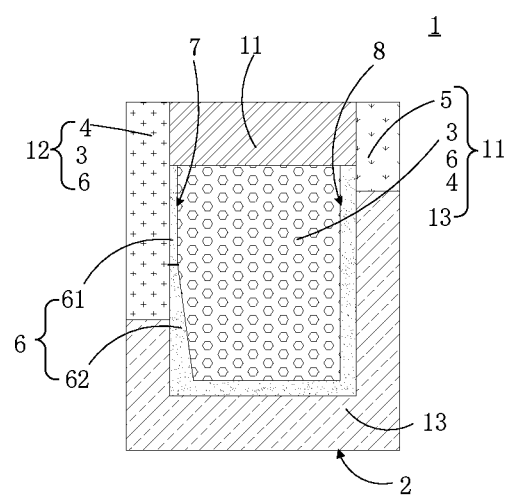
FIG. 20 is a schematic diagram of a formed semiconductor structure according to an exemplary embodiment.
Figure 23:
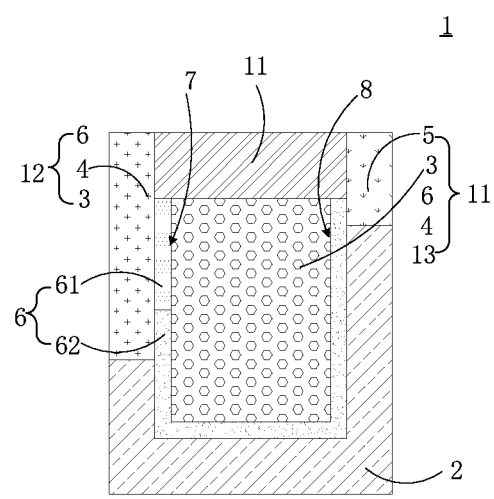
FIG. 23 is a schematic diagram of a formed semiconductor structure according to an exemplary embodiment.

As shown in FIG. 14, FIG. 20, and FIG. 23, in this embodiment, the gate 3 is formed through any one of the foregoing deposition processes. The gate 3 covers the oxide layer 6 and fills up part of the first trench 23. The gate 3 includes a first sidewall 7 and a second sidewall 8 arranged opposite to each other. A material of the gate 3 may include any one from the group consisting of titanium or an alloy thereof, tantalum or an alloy thereof, or tungsten or an alloy thereof.

Step S140: Form an insulating layer above the gate, where the insulating layer covers the top surface of the gate and the top surface of the oxide layer, and a top surface of the insulating layer is flush with the top surface of the substrate.

Figure 15:
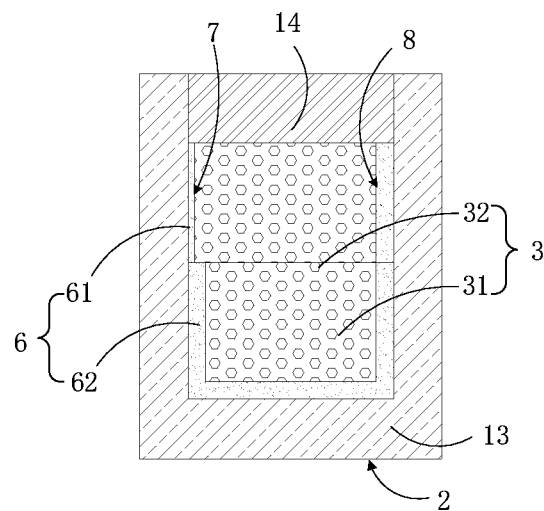
FIG. 15 is a schematic diagram of forming a first doped region and a second doped region according to an exemplary embodiment.

As shown in FIG. 15, FIG. 20, and FIG. 23 with reference to FIG. 14, the insulating layer 14 may be formed through any one of the following deposition processes: chemical vapor deposition, physical vapor deposition, atomic layer deposition or sputtering. The insulating layer 14 covers the top surface of the gate 3 and the top surface of the oxide layer 6 and fills up an unfilled region of the first trench 23. In this embodiment, the insulating layer 14 may be made of at least one of silicon nitride or silicon oxynitride. The insulating layer 14 is configured to isolate devices in the semiconductor structure, to avoid short-circuiting of devices in the semiconductor structure when the semiconductor structure is powered on. Moreover, the insulating layer 14 can prevent the process of forming a first doped region 4 and a second doped region 5 (which will be described in detail in the following steps) from contaminating the gate 3.

Step S150: Form a first doped region and a second doped region in the substrate, where the first doped region is provided in the substrate and close to the first sidewall, and the second doped region is provided in the substrate and close to the second sidewall.

Figure 16:
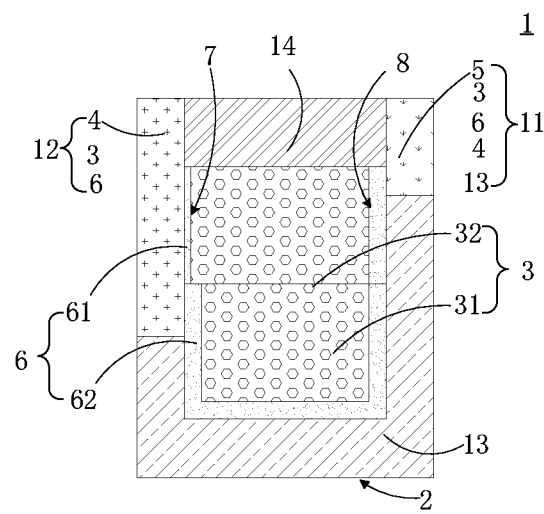
FIG. 16 is a schematic diagram of forming an insulating layer according to an exemplary embodiment.

As shown in FIG. 16, FIG. 20, and FIG. 23, in this embodiment, dopant ions of a second conductive type may be implanted into the substrate 2 close to the first sidewall 7 through ion implantation, to form the first doped region 4. Dopant ions of the second conductive type are implanted into the substrate 2 close to the second sidewall 8, to form the second doped region 5. The second conductive doping type is opposite to the first conductive doping type. The second conductive doping type may be an N-type conductive doping type or a P-type conductive doping type. In this embodiment, a bottom surface of the first doped region 4 is higher than a bottom surface of the gate 3, and a bottom surface of the second doped region 5 is higher than the bottom surface of the gate 3. As shown in FIG. 16, FIG. 20, and FIG. 23, after the first doped region 4 and the second doped region 5 are formed, the retained initial doped region 27 forms a third doped region 13. The third doped region 13 is located between the first doped region 4 and the second doped region 5, and the third doped region 13 surrounds part of the oxide layer 6.

It is understandable that, the first doped region 4 and the second doped region 5 may be formed by doping the initial doped region 27 with dopant ions of the second conductive type. That is, the first doped region 4 and the second doped region 5 may include dopant ions of the first conductive type, and concentration of the dopant ions of the second conductive type in the first doped region 4 and the second doped region 5 is greater than concentration of the dopant ions of the first conductive type. The first doped region 4 and the second doped region 5 present the second conductive type.

As shown in FIG. 16, FIG. 20, and FIG. 23, the gate 3, the first doped region 4, and the oxide layer 6 form a memory cell 12; the gate 3, the first doped region 4, the second doped region 5, and the oxide layer 6 form a selection unit 11; the memory cell 12 and the selection unit 11 jointly form an anti-fuse unit 1. In this embodiment, the selection unit 11 further includes the third doped region 13.

In the manufacturing method of this embodiment, the selection unit and the memory cell share the gate, and it is unnecessary to use an adjacent transistor as a select transistor of the anti-fuse structure, thereby reducing the size of the anti-fuse unit to release more available space for the semiconductor structure.

Figure 6:
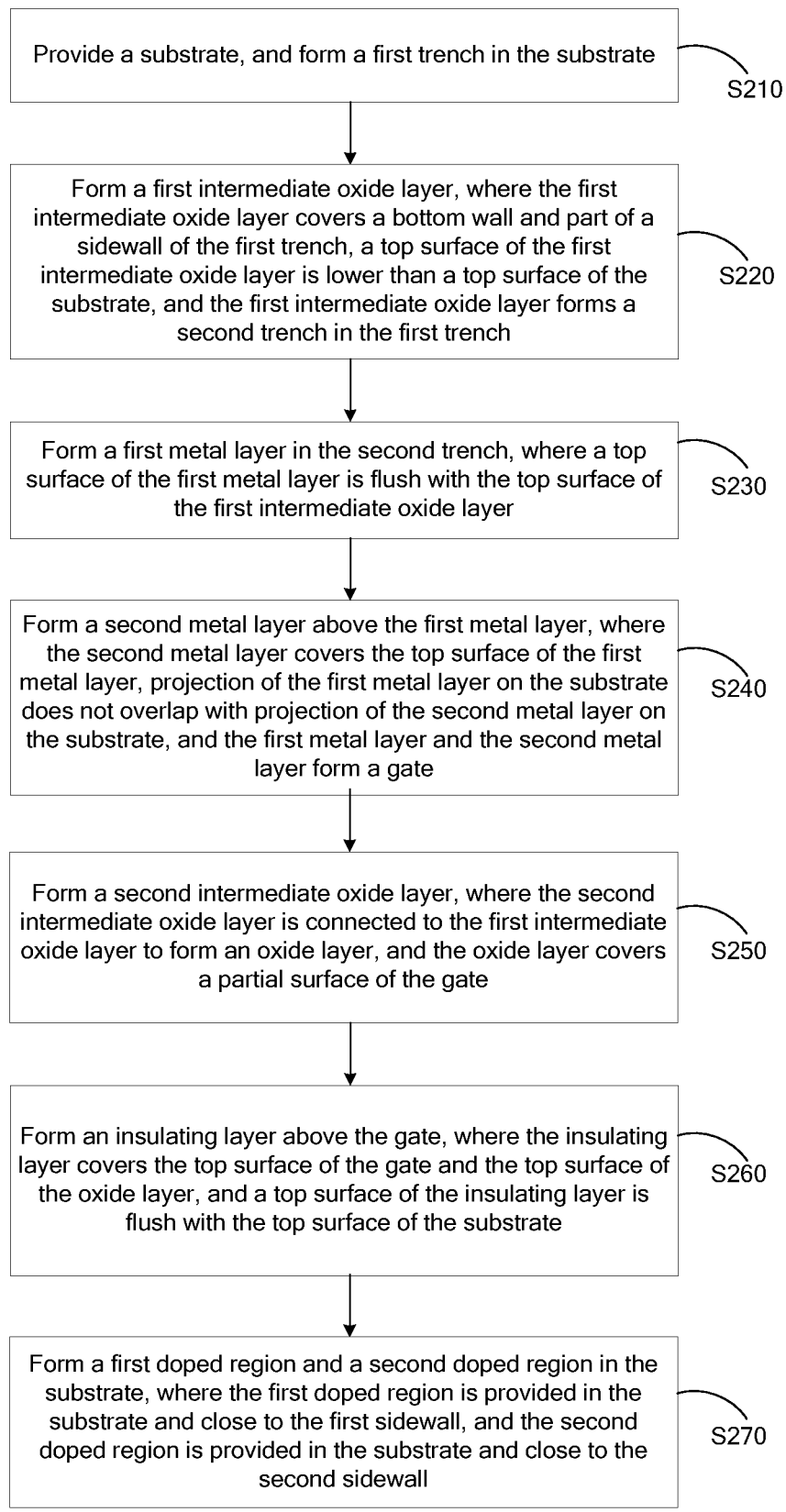
FIG. 6 is a flowchart of a method of manufacturing a semiconductor structure according to an exemplary embodiment.

As shown in FIG. 6, an embodiment of the present disclosure further provides a method of manufacturing a semiconductor structure. The method of manufacturing a semiconductor structure includes:

Step S210: Provide a substrate, and form a first trench in the substrate.

As shown in FIG. 9, the substrate 2 provided in this embodiment is the same as the substrate 2 provided in step S110 in the foregoing embodiment, and details are not described herein again.

Step S220: Form a first intermediate oxide layer, where the first intermediate oxide layer covers a bottom wall and part of a sidewall of the first trench, a top surface of the first intermediate oxide layer is lower than a top surface of the substrate, and the first intermediate oxide layer forms a second trench in the first trench.

In this embodiment, the first intermediate oxide layer may be formed through the following implementation.

Figure 10:
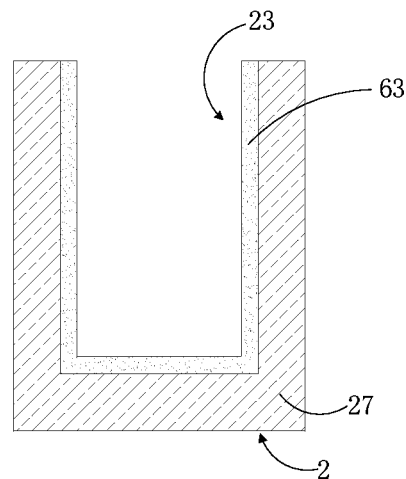
FIG. 10 is a schematic diagram of forming a first dielectric layer according to an exemplary embodiment.

First, as shown in FIG. 10, a dielectric material is formed through any one of the following deposition processes: chemical vapor deposition, physical vapor deposition, atomic layer deposition, or sputtering, to form a first dielectric layer 63, where the first dielectric layer 63 covers the bottom wall and the sidewall of the first trench 23.

Figure 11:
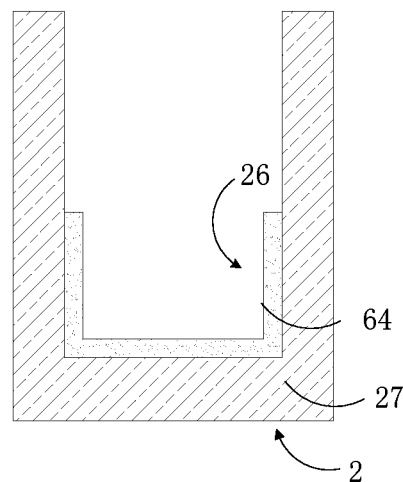
FIG. 11 is a schematic diagram of forming a first intermediate oxide layer according to an exemplary embodiment.

Then, as shown in FIG. 11, the first dielectric layer 63 is etched back to a predetermined depth, where the first dielectric layer 63 retained in the first trench 23 forms a first intermediate oxide layer 64, and the first intermediate oxide layer 64 defines a second trench 26 in the first trench 23.

Step S230: Form a first metal layer in the second trench, where a top surface of the first metal layer is flush with the top surface of the first intermediate oxide layer.

Figure 12:
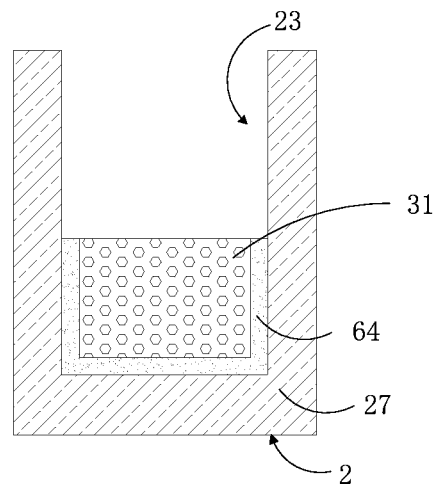
FIG. 12 is a schematic diagram of forming a first metal layer according to an exemplary embodiment.

In this embodiment, as shown in FIG. 12, referring to FIG. 11, a first metal layer 31 may be formed in the second trench 26 through the following implementation: depositing a conductive metal through any one of the foregoing deposition processes, where the conductive metal covers the first dielectric layer 63 and fills up the second trench 26, to form the first metal layer 31.

Step S240: Form a second metal layer above the first metal layer, where the second metal layer covers the top surface of the first metal layer, projection of the first metal layer on the substrate does not overlap with projection of the second metal layer on the substrate, and the first metal layer and the second metal layer form a gate.

In this embodiment, a second metal layer 32 may be formed above the first metal layer 31 through the following implementation:

A first mask (not shown in the figure) is formed. Referring to FIG. 12, the first mask covers the sidewall of the first trench 23 which is exposed from the first intermediate oxide layer 64, and the sidewalls at two sides of the first trench 23 are covered by the first mask of different widths. The first mask exposes part of the top surface of the first intermediate oxide layer 64 that covers one sidewall of the first trench 23.

Figure 13:
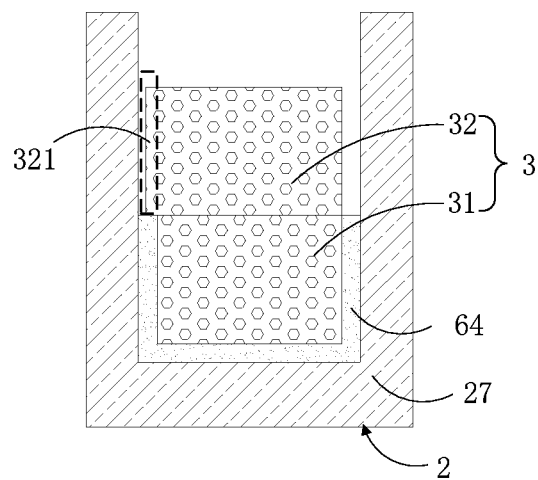
FIG. 13 is a schematic diagram of forming a second metal layer according to an exemplary embodiment.

Then, as shown in FIG. 13 with reference to FIG. 12, a conductive metal is deposited through atomic layer deposition, where an unfilled region of the first trench 23 is filled with the conductive metal. Next, the conductive metal is etched back until a top surface of the conductive metal is lower than the top surface of the substrate 2, and the conductive metal located above the first metal layer 31 forms the second metal layer 32. In this embodiment, as shown in FIG. 13, a side of the second metal layer 32 extends towards the sidewall of the first trench 23 to form an extended portion 321. The extended portion 321 covers part of the top surface of the first intermediate oxide layer 64. Projection of the first metal layer 31 on the substrate 2 is located within projection of the second metal layer 32 on the substrate 2. The first metal layer 31 and the second metal layer 32 form the gate 3.

In this embodiment, after the second metal layer 32 is formed, the first mask is removed through dry etching or wet etching. For example, the first mask may be dissolved by an etching solution.

Step S250: Form a second intermediate oxide layer, where the second intermediate oxide layer is connected to the first intermediate oxide layer to form an oxide layer, and the oxide layer covers a partial surface of the gate.

In this embodiment, as shown in FIG. 14 with reference to FIG. 13, first, a dielectric material is deposited through any one of the foregoing deposition processes, and an unfilled region in the first trench 23 is filled with the dielectric material. Then, the dielectric material is etched back until the top surface of the second metal layer 32 is exposed, where a remaining part of the dielectric material forms a second intermediate oxide layer 65.

As shown in FIG. 13, FIG. 14, and FIG. 15, part of the second intermediate oxide layer 65 located between the gate 3 and the sidewall of the first trench 23 forms the first oxide layer 61; the first intermediate oxide layer 64 and a remaining part of the second intermediate oxide layer 65 jointly form the second oxide layer 62. A thickness of the first oxide layer 61 is less than a thickness of the second oxide layer 62.

In this embodiment, a material of the first intermediate oxide layer 64 is the same as that of the second intermediate oxide layer 65. Therefore, the material of the first oxide layer 61 is also the same as that of the second oxide layer 62. That is, the first oxide layer 61 and the second oxide layer 62 have the same dielectric constant, but the thickness of the first oxide layer 61 is less than the thickness of the second oxide layer 62 such that a breakdown voltage of the first oxide layer 61 is lower than a breakdown voltage of the second oxide layer 62. The breakdown voltage of the first oxide layer 61 is a first voltage V1. The first oxide layer 61 can be broken down by applying the first voltage V1 to the gate, to form a conductive path (referring to FIG. 1 or FIG. 2) in the gate 3 and a first doped region 4 (which will be described in detail in the following steps).

Step S260: Form an insulating layer above the gate, where the insulating layer covers the top surface of the gate and the top surface of the oxide layer, and a top surface of the insulating layer is flush with the top surface of the substrate.

The implementation of step S260 in this embodiment is the same as that of step S140 in the foregoing embodiment. Details are not described herein again.

Step S270: Form a first doped region and a second doped region in the substrate, where the first doped region is provided in the substrate and close to the first sidewall, and the second doped region is provided in the substrate and close to the second sidewall.

As shown in FIG. 16, first doping is performed on the substrate 2 to form the first doped region 4. The first doped region 4 is adjacent to the first sidewall 7, and a bottom surface of the first doped region 4 is lower than the bottom surface of the first oxide layer 61 and higher than the bottom surface of the gate 3. The first doped region 4 and the gate 3 are partially separated by the first oxide layer 61 and partially separated by the second oxide layer 62, such that after the first oxide layer 61 is broken down, the second oxide layer 62 still has an insulating effect.

As shown in FIG. 16, second doping is performed on the substrate 2 to form a second doped region 5. The second doped region 5 is adjacent to the second sidewall 8, and a bottom surface of the second doped region 5 is lower than the top surface of the gate 3 and higher than the bottom surface of the first oxide layer 61.

As shown in FIG. 16, after the first doped region 4 and the second doped region 5 are formed, the initial doped region 27 retained in the substrate 2 forms a third doped region 13.

In the manufacturing method of this embodiment, the oxide layer is formed through two deposition processes, such that the oxide layer includes the first oxide layer and the second oxide layer that have different thicknesses. The thickness of the first oxide layer is less than that of the second oxide layer, and the breakdown voltage of the first oxide layer is lower than that of the second oxide layer. The first oxide layer is located between the gate and the first doped region. The first oxide layer can be broken down by applying the first voltage or a higher voltage to the gate, to complete writing into the anti-fuse unit, and it is unnecessary to additionally configure a select transistor for the anti-fuse unit.

Figure 7:
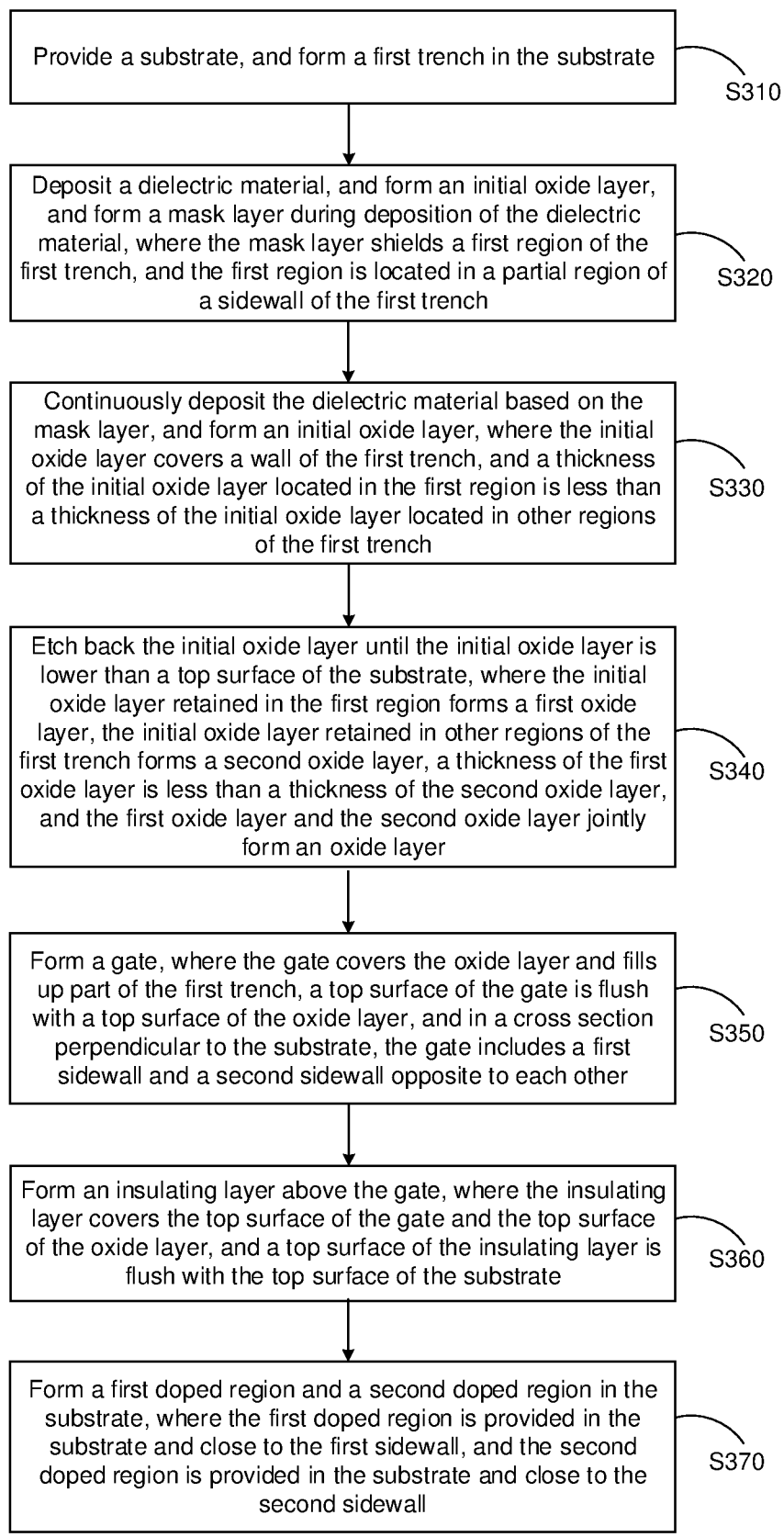
FIG. 7 is a flowchart of a method of manufacturing a semiconductor structure according to an exemplary embodiment.

As shown in FIG. 7, an embodiment of the present disclosure further provides a method of manufacturing a semiconductor structure. The method of manufacturing a semiconductor structure includes:

Step S310: Provide a substrate, and form a first trench in the substrate.

Figure 17:
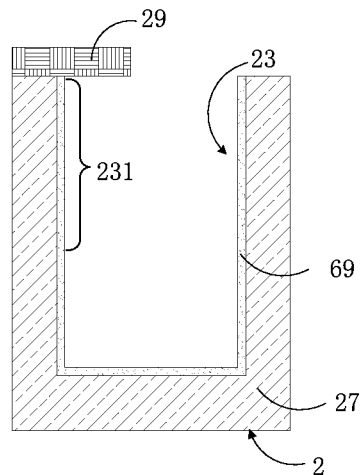
FIG. 17 is a schematic diagram for forming a mask layer according to an exemplary embodiment.

As shown in FIG. 17, the substrate 2 provided in this embodiment is the same as the substrate 2 provided in step S110 in the foregoing embodiment, and details are not described herein again.

Step S320: Deposit a dielectric material, and form an initial oxide layer.

In this embodiment, the dielectric material may be deposited through any one of the following deposition processes: chemical vapor deposition, physical vapor deposition, atomic layer deposition or sputtering. The dielectric material covers a wall of the first trench 23 to form an initial oxide layer 69.

Step S330: Deposit the dielectric material through a mask layer, and form an intermediate oxide layer, where the mask layer shields a first region of the first trench, and the first region is located in a partial region of a sidewall of the first trench.

Figure 18:
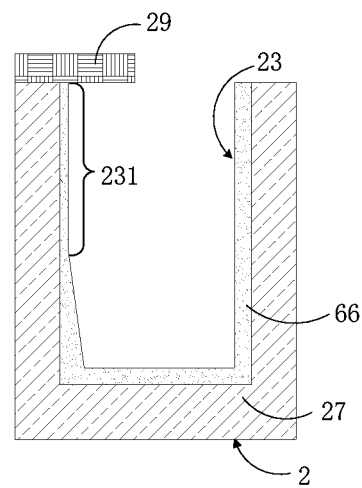
FIG. 18 is a schematic diagram of forming an initial oxide layer according to an exemplary embodiment.

As shown in FIG. 17, after the initial oxide layer 69 is formed, a mask layer 29 is formed, where the mask layer 29 shields a first region 231 of the first trench 23. As shown in FIG. 18, the dielectric material is continuously deposited based on the mask layer 29. The dielectric material covers the initial oxide layer 69 outside the first region 231. The deposition is stopped after a thickness of the dielectric material in regions other than the first region 231 reaches a target thickness. The initial oxide layer 69 and the dielectric material that covers the initial oxide layer 69 jointly form an intermediate oxide layer 66. The thickness of the intermediate oxide layer 66 located in the first region 231 is less than the thickness of the intermediate oxide layer 66 in other regions.

Step S340: Etch back the intermediate oxide layer until the intermediate oxide layer is lower than a top surface of the substrate, where the intermediate oxide layer retained in the first region forms a first oxide layer, the intermediate oxide layer retained in other regions of the first trench forms a second oxide layer, a thickness of the first oxide layer is less than a thickness of the second oxide layer, and the first oxide layer and the second oxide layer jointly form an oxide layer.

As shown in FIG. 19 with reference to FIG. 18, the intermediate oxide layer 66 is etched back, the intermediate oxide layer 66 retained after the back etching forms an oxide layer 6, and a top surface of the oxide layer 6 is higher than a bottom surface of the first region 231. The intermediate oxide layer 66 retained in the first region 231 forms the first oxide layer 61, and the intermediate oxide layer 66 retained in other regions forms the second oxide layer 62. The thickness of the first oxide layer 61 is less than the thickness of the second oxide layer 62, and the first oxide layer 61 and the second oxide layer 62 jointly form the oxide layer 6.

Step S350: Form a gate, where the gate covers the oxide layer and fills up part of the first trench, a top surface of the gate is flush with a top surface of the oxide layer, and in a cross section perpendicular to the substrate, the gate includes a first sidewall and a second sidewall opposite to each other.

In this embodiment, as shown in FIG. 20, the gate 3 may be formed through the following implementation: First, after the intermediate oxide layer 66 is formed, a conductive metal is deposited through any one of the foregoing deposition processes, where the conductive metal covers the intermediate oxide layer 66 and fills up an unfilled part in the first trench 23.

Then, the conductive metal is etched back until the top surface is lower than the top surface of the substrate 2, and the conductive metal retained in the first trench 23 forms the gate 3. In this embodiment, the intermediate oxide layer 66 and the conductive metal are etched back in the same etching process. The etching process has the same etching selectivity for the intermediate oxide layer 66 and the conductive metal, and the oxide layer 6 and the gate 3 are formed at the same time.

Step S360: Form an insulating layer above the gate, where the insulating layer covers the top surface of the gate and the top surface of the oxide layer, and a top surface of the insulating layer is flush with the top surface of the substrate.

Step S370: Form a first doped region and a second doped region in the substrate, where the first doped region is provided in the substrate and close to the first sidewall, and the second doped region is provided in the substrate and close to the second sidewall.

The implementation of step S360 and step S370 in this embodiment is the same as that of step S260 and step S270 in the foregoing embodiment. Details are not described herein again.

The first oxide layer and the second oxide layer formed in this embodiment are made of the same material and have the same dielectric constant. The thickness of the first oxide layer is less than the thickness of the second oxide layer. Therefore, the breakdown voltage of the first oxide layer is lower than the breakdown voltage of the second oxide layer.

In the manufacturing method of this embodiment, the first oxide layer and the second oxide layer are formed in the same deposition process, which simplifies the process steps, reduces the process cost and time, and improves the production efficiency.

Figure 8:
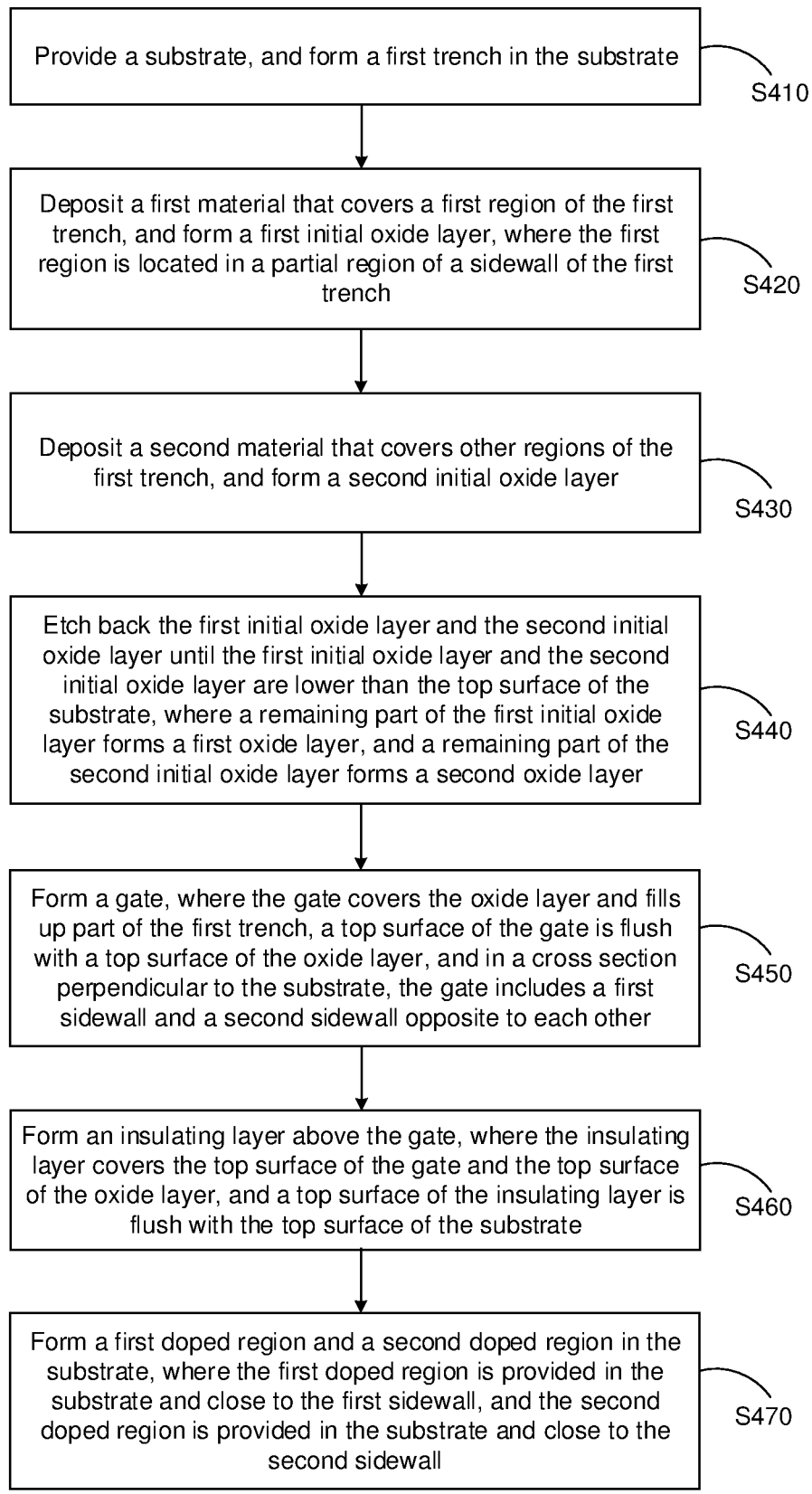
FIG. 8 is a flowchart of a method of manufacturing a semiconductor structure according to an exemplary embodiment.

As shown in FIG. 8, an embodiment of the present disclosure further provides a method of manufacturing a semiconductor structure. The method of manufacturing a semiconductor structure includes:

Step S410: Provide a substrate, and form a first trench in the substrate.

Figure 21:
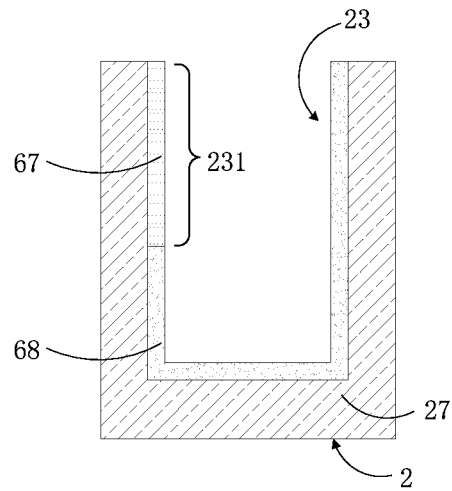
FIG. 21 is a schematic diagram of forming a first initial oxide layer and a second initial oxide layer according to an exemplary embodiment.

Referring to FIG. 21, the substrate 2 provided in this embodiment is the same as the substrate 2 provided in step S110 in the foregoing embodiment, and details are not described herein again.

Step S420: Deposit a first material that covers a first region of the first trench, and form a first initial oxide layer, where the first region is located in a partial region of a sidewall of the first trench.

As shown in FIG. 21, first, a second mask (not shown in the figure) is formed. The second mask covers a bottom wall and part of a sidewall of the first trench 23. The second mask exposes a first region 231 that is located on one sidewall of the first trench 23. Then, a first material is deposited through any one of the following deposition processes: chemical vapor deposition, physical vapor deposition, atomic layer deposition or sputtering. The first region 231 forms a first initial oxide layer 67, where the first material has a first dielectric constant K1.

Step S430: Deposit a second material that covers other regions of the first trench, and form a second initial oxide layer.

As shown in FIG. 21, first, a third mask is formed, where the third mask covers the first initial oxide layer 67. The second mask is removed to expose other regions of the first trench 23. Then, the second material is deposited through any one of the foregoing deposition processes to form a second initial oxide layer 68, where the second initial oxide layer 68 covers the bottom wall of the first trench 23 and the exposed sidewall of the first trench 23. The second material has a second dielectric constant K2, and the first dielectric constant K1 is greater than the second dielectric constant K2.

Step S440: Etch back the first initial oxide layer and the second initial oxide layer until the first initial oxide layer and the second initial oxide layer are lower than the top surface of the substrate, where a remaining part of the first initial oxide layer forms a first oxide layer, and a remaining part of the second initial oxide layer forms a second oxide layer.

As shown in FIG. 21 and FIG. 22, the first initial oxide layer 67 and the second initial oxide layer 68 are etched back. The first initial oxide layer 67 retained after the back etching forms a first oxide layer 61, and a remaining part of the second initial oxide layer 68 forms a second oxide layer 38. The first oxide layer 61 and the second oxide layer 62 jointly form an oxide layer 6.

Step S450: Form a gate, where the gate covers the oxide layer and fills up part of the first trench, a top surface of the gate is flush with a top surface of the oxide layer, and in a cross section perpendicular to the substrate, the gate includes a first sidewall and a second sidewall opposite to each other.

Step S460: Form an insulating layer above the gate, where the insulating layer covers the top surface of the gate and the top surface of the oxide layer, and a top surface of the insulating layer is flush with the top surface of the substrate.

Step S470: Form a first doped region and a second doped region in the substrate, where the first doped region is provided in the substrate and close to the first sidewall, and the second doped region is provided in the substrate and close to the second sidewall.

The implementation of step S450 to step S470 in this embodiment is the same as that of step S350 to step S370 in the foregoing embodiment. Details are not described herein again.

As shown in FIG. 23, in the semiconductor structure formed in this embodiment, the thickness of the first oxide layer 61 is the same as the thickness of the second oxide layer 62, and the dielectric constant of the first oxide layer 61 is greater than the dielectric constant of the second oxide layer 62, such that the breakdown voltage of the first oxide layer 61 is lower than the breakdown voltage of the second oxide layer 62. The first oxide layer 61 is broken down more easily than the second oxide layer 62, so as to form a conductive path between the gate 3 and the first doped region 4.

In the manufacturing method of this embodiment, the breakdown voltage of part of the oxide layer between the first sidewall and the first doped region is different from the breakdown voltage of the rest of the oxide layer, such that part of the oxide layer located between the gate and the first doped region can be broken down more easily. Moreover, when the first doped region is formed, the depth of first doping is defined according to the bottom surface of the first oxide layer and the bottom surface of the gate, such that the bottom surface of the first doped region is higher than the bottom surface of the gate and lower than the bottom surface of the first oxide layer. In this way, the gate, the second oxide layer, the first doped region, and the second doped region can continue to work as a transistor. It is unnecessary to additionally configure a select transistor for the anti-fuse unit. The anti-fuse unit consists of only one semiconductor device, thereby reducing the size of the anti-fuse unit and providing more available space for the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising at least one anti-fuse unit that each comprises a selection unit and a memory cell, wherein the semiconductor structure comprises:
   a substrate;
   a gate, provided in the substrate, wherein in a cross section perpendicular to the substrate, the gate comprises a first sidewall and a second sidewall opposite to each other;
   a first doped region, provided in the substrate and close to the first sidewall;
   a second doped region, provided in the substrate and close to the second sidewall; and
   an oxide layer, covering a partial surface of the gate;
   wherein the gate, the first doped region and the oxide layer form the memory cell; the gate, the first doped region, the second doped region, and the oxide layer form the selection unit.

2. The semiconductor structure according to claim 1, wherein the oxide layer comprises a first oxide layer and a second oxide layer, the memory cell comprises the first oxide layer, and the selection unit comprises the second oxide layer.

3. The semiconductor structure according to claim 2, wherein a dielectric constant of the first oxide layer is greater than a dielectric constant of the second oxide layer.

4. The semiconductor structure according to claim 2, wherein a thickness of the first oxide layer is less than a thickness of the second oxide layer.

5. The semiconductor structure according to claim 2, wherein a projection of the first doped region on the first sidewall covers a projection of the first oxide layer on the first sidewall, and the second oxide layer comprises the oxide layer other than the first oxide layer.

6. The semiconductor structure according to claim 5, wherein in the cross section perpendicular to the substrate, a bottom surface of the first oxide layer is higher than a bottom surface of the first doped region.

7. The semiconductor structure according to claim 1, wherein the selection unit further comprises a third doped region, the third doped region is provided in the substrate, the third doped region is located between the first doped region and the second doped region, and the third doped region surrounds part of the oxide layer; and
   a conductive type of dopant ions of the first doped region is the same as a conductive type of dopant ions of the second doped region, and a conductive type of dopant ions of the third doped region is opposite to the conductive types of the dopant ions of the first doped region and the second doped region.

8. The semiconductor structure according to claim 1, wherein in the cross section perpendicular to the substrate, a top surface of the gate is higher than a bottom surface of the first doped region and a bottom surface of the second doped region.

9. The semiconductor structure according to claim 1, further comprising:
   an insulating layer, covering a top surface of the gate and a top surface of the oxide layer, wherein a top surface of the insulating layer is flush with a top surface of the substrate.

10. A method of manufacturing a semiconductor structure, comprising:
   providing a substrate, and forming a first trench in the substrate;
   forming an oxide layer, wherein the oxide layer covers a bottom wall and part of a sidewall of the first trench, and a top surface of the oxide layer is lower than a top surface of the substrate;
   forming a gate, wherein the gate covers the oxide layer and fills up part of the first trench, a top surface of the gate is flush with the top surface of the oxide layer, and in a cross section perpendicular to the substrate, the gate comprises a first sidewall and a second sidewall opposite to each other; and
   forming a first doped region and a second doped region in the substrate, wherein the first doped region is provided in the substrate and close to the first sidewall, and the second doped region is provided in the substrate and close to the second sidewall;
   wherein the gate, the first doped region, and the oxide layer form a memory cell; the gate, the first doped region, the second doped region, and the oxide layer form a selection unit; and the memory cell and the selection unit jointly form an anti-fuse unit.

11. The method of manufacturing a semiconductor structure according to claim 10, wherein the forming an oxide layer comprises:
forming a first intermediate oxide layer, wherein the first intermediate oxide layer covers the bottom wall and part of the sidewall of the first trench, a top surface of the first intermediate oxide layer is lower than the top surface of the substrate, and the first intermediate oxide layer forms a second trench in the first trench; and
forming a second intermediate oxide layer, wherein the second intermediate oxide layer is connected to the first intermediate oxide layer to form the oxide layer, and the oxide layer covers a partial surface of the gate.

12. The method of manufacturing a semiconductor structure according to claim 11, wherein the forming a gate comprises:
forming a first metal layer in the second trench, wherein a top surface of the first metal layer is flush with the top surface of the first intermediate oxide layer; and
forming a second metal layer above the first metal layer, wherein the second metal layer covers the top surface of the first metal layer, projection of the first metal layer on the substrate does not overlap with projection of the second metal layer on the substrate, and the first metal layer and the second metal layer form the gate.

13. The method of manufacturing a semiconductor structure according to claim 12, wherein the forming a second intermediate oxide layer comprises:
depositing a dielectric material, wherein an unfilled region in the first trench is filled with the dielectric material; and
etching back the dielectric material until a top surface of the second metal layer is exposed, wherein a remaining part of the dielectric material forms the second intermediate oxide layer;
wherein part of the second intermediate oxide layer located between the gate and the sidewall of the first trench forms a first oxide layer, the first intermediate oxide layer and a remaining part of the second intermediate oxide layer jointly form a second oxide layer, and a thickness of the first oxide layer is less than a thickness of the second oxide layer.

14. The method of manufacturing a semiconductor structure according to claim 10, wherein the forming an oxide layer comprises:
depositing a dielectric material, and forming an initial oxide layer;
depositing the dielectric material through a mask layer, and forming an intermediate oxide layer, wherein the mask layer shields a first region of the first trench, the first region is located in a partial region of a sidewall of the first trench, the intermediate oxide layer covers a wall of the first trench, and a thickness of the intermediate oxide layer located in the first region is less than a thickness of the intermediate oxide layer in other regions of the first trench; and
etching back the intermediate oxide layer until the intermediate oxide layer is lower than the top surface of the substrate, wherein the intermediate oxide layer retained in the first region forms a first oxide layer, the intermediate oxide layer retained in other regions of the first trench forms a second oxide layer, a thickness of the first oxide layer is less than a thickness of the second oxide layer, and the first oxide layer and the second oxide layer jointly form the oxide layer.

15. The method of manufacturing a semiconductor structure according to claim 10, wherein the forming an oxide layer comprises:
depositing a first material that covers a first region of the first trench, and forming a first initial oxide layer, wherein the first region is located in a partial region of a sidewall of the first trench;
depositing a second material that covers other regions of the first trench, and forming a second initial oxide layer; and
etching back the first initial oxide layer and the second initial oxide layer until the first initial oxide layer and the second initial oxide layer are lower than the top surface of the substrate, wherein a remaining part of the first initial oxide layer forms a first oxide layer, and a remaining part of the second initial oxide layer forms a second oxide layer;
wherein a dielectric constant of the first oxide layer is greater than a dielectric constant of the second oxide layer, and the first oxide layer and the second oxide layer jointly form the oxide layer.

16. The method of manufacturing a semiconductor structure according to claim 13, wherein the forming a first doped region and a second doped region comprises:
performing first doping on the substrate, and forming the first doped region, wherein the first doped region is adjacent to the first sidewall, and a bottom surface of the first doped region is lower than a bottom surface of the first oxide layer and higher than a bottom surface of the gate; and
performing second doping on the substrate, and forming the second doped region, wherein the second doped region is adjacent to the second sidewall, and a bottom surface of the second doped region is lower than the top surface of the gate and higher than the bottom surface of the first oxide layer.

17. The method of manufacturing a semiconductor structure according to claim 10, further comprising:
forming an insulating layer above the gate, wherein the insulating layer covers the top surface of the gate and the top surface of the oxide layer, and a top surface of the insulating layer is flush with the top surface of the substrate.

* * * * *